(12) United States Patent
Cai et al.

(10) Patent No.: US 10,476,660 B1
(45) Date of Patent: Nov. 12, 2019

(54) QUADRATURE SIGNAL GENERATION

(71) Applicant: Micron Technology, Inc., Boise, ID (US)

(72) Inventors: Liuchun Cai, Shoreview, MN (US); Steven G. Wurzer, Blaine, MN (US); Gregory A. King, Hastings, MN (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/155,512

(22) Filed: Oct. 9, 2018

(51) Int. Cl.
| H04B 1/26 | (2006.01) |
| H04B 7/00 | (2006.01) |
| H04L 7/04 | (2006.01) |
| H03H 7/21 | (2006.01) |
| H03B 27/00 | (2006.01) |
| H03L 7/06 | (2006.01) |

(52) U.S. Cl.
CPC ............... *H04L 7/04* (2013.01); *H03B 27/00* (2013.01); *H03H 7/21* (2013.01); *H03L 7/06* (2013.01)

(58) Field of Classification Search
CPC combination set(s) only.
See application file for complete search history.

(56) References Cited

U.S. PATENT DOCUMENTS

| 6,985,049 | B2* | 1/2006 | Hyoung | H01P 1/185 333/156 |
| 7,010,287 | B2* | 3/2006 | Oh | H03B 27/00 327/113 |
| 8,274,338 | B2* | 9/2012 | Leong | H03B 27/00 331/45 |
| 9,240,879 | B2* | 1/2016 | Shi | H04L 7/0037 |

OTHER PUBLICATIONS

Razavi, Behzad, "RF Micron Electronics", Englewood Cliffs, NJ: Prentice-Hall, 1998, pp. 236-239.
Behbahani et al., "CMOS Mixers and Polyphase Filters for Large Image Rejection", IEEE Journal of Solid-State Circuits, vol. 36, Issue No. 6, Jun. 2001, pp. 873-887.
Kaukovuori et al., "Analysis and Design of Passive Polyphase Filters", IEEE Transactions on Circuits and Systems I: Reg. Papers, vol. 55, Issue No. 10, Nov. 2008, pp. 3023-3037.
Kulkarni et al., "Design of an Optimal Layout Polyphase Filter for Millimeter-Wave Quadrature LO Generation", IEEE Transactions on Circuits and Systems II: Express Briefs, vol. 60, Issue No. 4, Nov. 2013, pp. 202-206.

* cited by examiner

*Primary Examiner* — An T Luu
(74) *Attorney, Agent, or Firm* — Brooks, Cameron & Huebsch, PLLC (57) ABSTRACT

Apparatuses and methods for quadrature signal generation are provided. An example includes a quadrature signal generator. The quadrature signal generator is configured to generate, based on a received differential signal, a plurality of quadrature clock signals at a same frequency as that of the received differential signal. The quadrature signal generator is also configured to provide the plurality of quadrature clock signals to a memory system.

19 Claims, 7 Drawing Sheets

QUADRATURE SIGNAL GENERATION

TECHNICAL FIELD

The present disclosure relates generally to memory, and more particularly, to apparatus and methods for quadrature signal generation.

BACKGROUND

Digital and mixed digital-analog circuits often operate based on timing clocks which may be generated from a master clock. These timing clocks may be generated using a clock generator such as a programmable phase-locked loop (PLL) and associated control and/or signal shaping circuitry. The characteristics of timing clocks provided to electronic system components can affect various system parameters. For example, in memory systems, parameters such as memory interface bandwidth can depend on characteristics such as clock frequency.

DETAILED DESCRIPTION

The present disclosure includes apparatuses and methods associated with quadrature signal generation. An example includes a quadrature signal generator. The quadrature signal generator is configured to generate, based on a differential signal, a plurality of quadrature clock signals at a same frequency as that of the received differential signal. The quadrature signal generator is also configured to provide the plurality of quadrature clock signals to a memory system.

Embodiments of the present disclosure includes providing quadrature clock signals by using a quadrature signal generator. In a number of embodiments, a filter bank such as a polyphase filter (e.g., a passive polyphase filter) can be an example of the quadrature signal generator. As used herein, a filter bank refers to a device that separates an input signal into multiple signals each carrying a single frequency sub-band of the input signal, and a polyphase filter refers to a filter bank that separates an input signal into multiple signals each carrying an equidistant frequency sub-band of the input signal.

Quadrature signal generation, which may be referred to as "IQ" signal generation, has been used in, for example, various radio frequency (RF) applications such as front-end signal processing. Quadrature signal generation can also be useful in clocking systems for memory systems such as double data rate (DDR) memory systems in order to improve interface bandwidth, for example. However, various quadrature signal generation methods can have drawbacks such as increasing the size of a memory system, increasing power consumption, and/or increasing noise of the clock signals, among other drawbacks. For example, in some approaches, a divide-by-two circuit along with an oscillator at twice the desired local oscillator (LO) frequency has been used to generate the quadrature signals. Using the divide-by-two circuit along with the PLL, therefore, may require an operating frequency of the PLL to be at least twice of the desired frequencies of the quadrature signals, which can lead to high phase noise, increased power usage, and increased area. Alternatively, a PLL may be used with two coupled local oscillators. However, using the two oscillators may require a larger inductor area (e.g., twice than had the local oscillators not been used), which can lead to phase noise and/or difficulty associated with signal tuning and accuracy.

In contrast, embodiments of the present disclosure can include providing quadrature clock signals generated at a same frequency as that of those signals generated from the clock generator (e.g., PLL) while providing quadrature signals operating in a wideband frequency range (e.g., 2.5 gigahertz (GHz) to 5 GHz) to meet high bandwidth requirements of state-of-the-art circuits and systems such as DDR memory systems.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 104 may reference element "04" in FIG. 1, and a similar element may be referenced as 204 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
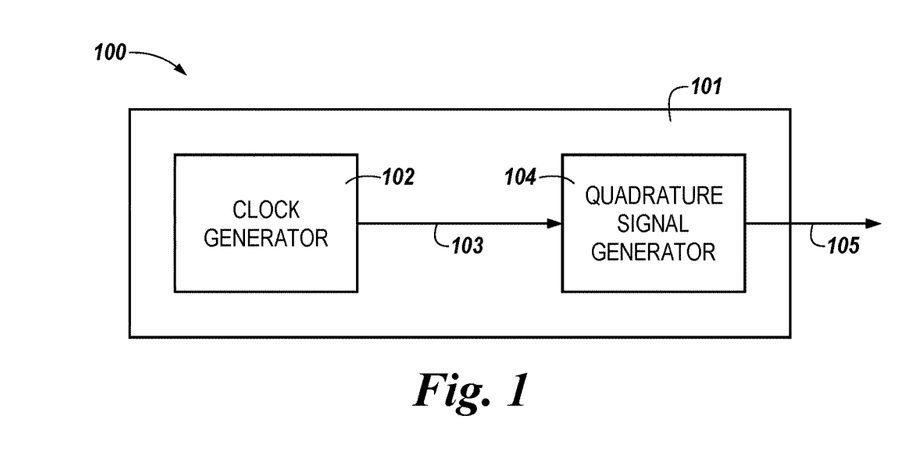
FIG. 1 is a block diagram of a system including a clocking system in accordance with a number of embodiments of the present disclosure.

FIG. 1 is a block diagram of a system 100 including a clocking system 101 in accordance with a number of embodiments of the present disclosure. The clocking system 101 includes a clock generator 102 and a quadrature signal generator 104.

The clocking system 101 may be located in various locations within the system 100. As an example, the system 100 may comprise a host and the clocking system 101 may be located within the host. The host can include a system motherboard and/or backplane and can include a number of processing resources (e.g., one or more processors, microprocessors, or some other type of controlling circuitry), such as a central processing unit (CPU). An example host can be a personal laptop computer, a desktop computer, a digital camera, a mobile telephone, or a memory card reader, among various other types of hosts. As another example, the system 100 may comprise a memory system, which can be a memory system serving as main memory such as a DRAM system and/or a memory system serving as a storage volume such as a solid state drive (SSD), although embodiments are not so limited.

The clock generator 102 may include a circuit, such as a PLL, that produces a clock signal based on a received external clock signal (e.g., master clock or reference clock). As an example, in embodiments in which the system 100 comprises a memory system, the clock generator 102 can receive a clock signal from a host (not shown) to which the system 100 is coupled.

The clock signal 103 generated at the clock generator 102 can be used as a sampling signal(s) that the quadrature signal generator 104 can use to generate other signals. In a number of embodiments, the clock signal 103 can comprise a complementary pair of differential signals. For example, signals of the pair can be 180° out of phase with one another. Therefore, the clock signal 103 can be referred to as differential signals.

The quadrature signal generator 104 can generate quadrature clock signals 105 based on the clock signal 103 received from the clock generator 102. As used herein, quadrature signals refer to signals in each quadrant being 90° out of phase relative to each other such that the generated signal is provided at 0°, 90°, 180°, and 270°. The quadrature clock signals can include an in-phase (I) signal(s) and a quadrature-phase (Q) signal(s), which are phase-shifted by 90° relative to each other.

In a number of embodiments, the quadrature signal generator 104 can be a filter bank and configured to generate the quadrature clock signals 105 at a same frequency as that of the differential signal 103. For example, a frequency of each signal generated at the quadrature signal generator 104 can be equivalent to that of at least one of the clock signals 103 received from the clock generator 102. As an example, a frequency of the input clock signal 103 may be 5 GHz and the frequency of the quadrature clock signal 105 can as also be 5 GHz. However, embodiments are not limited to a particular clock frequency or clock frequency range.

The quadrature clock signals 105 generated at the quadrature signal generator can be provided to a host and/or a memory device (not shown) and used to control timing of various components thereof. The memory device can comprise a DRAM device, SRAM device, STT RAM device, PCRAM device, RRAM device, and/or NAND flash device, among various other memory device types.

The quadrature clock signals 105 generated at the quadrature signal generator can be used, for example, to control timing operations of a memory system. For example, the quadrature clock signals 105 can control the timing of data signals transmitted between a host and a memory system. For instance, the clock signals 105 can comprise current mode logic (CIVIL) clocks.

Figure 2:
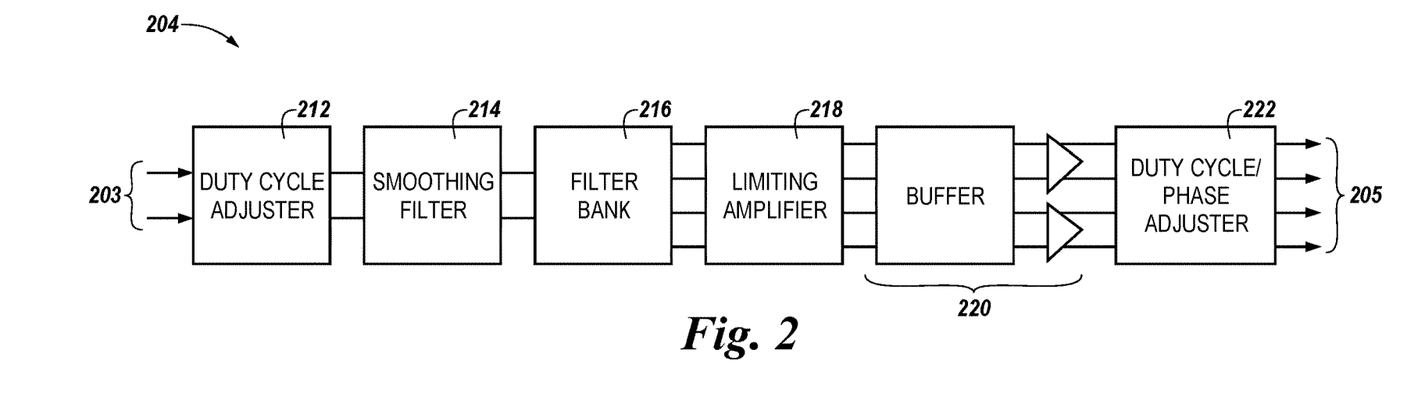
FIG. 2 illustrates a quadrature signal generator in accordance with a number of embodiments of the present disclosure.

FIG. 2 illustrates a quadrature signal generator 204 in accordance with a number of embodiments of the present disclosure. The quadrature signal generator 204 may include a duty cycle adjuster 212, a smoothing filter 214, a filter bank 216, a limiting amplifier block 218, an output buffer 220, and a duty cycle/phase adjuster 222. As one example, the quadrature signal generator 204 illustrated in FIG. 2 may be fabricated in a complementary metal-oxide-semiconductor (CMOS) technology.

The quadrature signal generator 204 receives differential signals 203 (e.g., differential signals 103) and performs a quadrature signal generation of quadrature clock signals 205 (e.g., quadrature clock signals 105). The duty cycle adjuster 212 receives differential signals (e.g., $I_{CLK\_T}$ and $T_{CLK\_C}$), for example, via an input channel coupled to a clock generator such as the clock generator 102. The duty cycle adjuster 212 can be configured to adjust a duty cycle of the differential signals. The differential signals received at the duty cycle adjuster 212 may have a non-sinusoidal waveform such as a square waveform. An example duty cycle adjuster is described below in association with FIG. 3.

The quadrature signal generator 204 includes the smoothing filter 214, which may be a low pass filter. While the received differential signal may be of a non-sinusoidal waveform, the filter bank 216 such as a polyphase filter may operate with a sinusoidal waveform. Accordingly, in a number of embodiments, the smoothing filter 214 can be configured to convert the differential signals to a sinusoidal waveform to match a waveform the filter bank 216 operates with. The smoothing filter 214 may include a number of buffers coupled to each other (e.g., in series), as further described and illustrated in connection with FIG. 4.

Figure 5A:
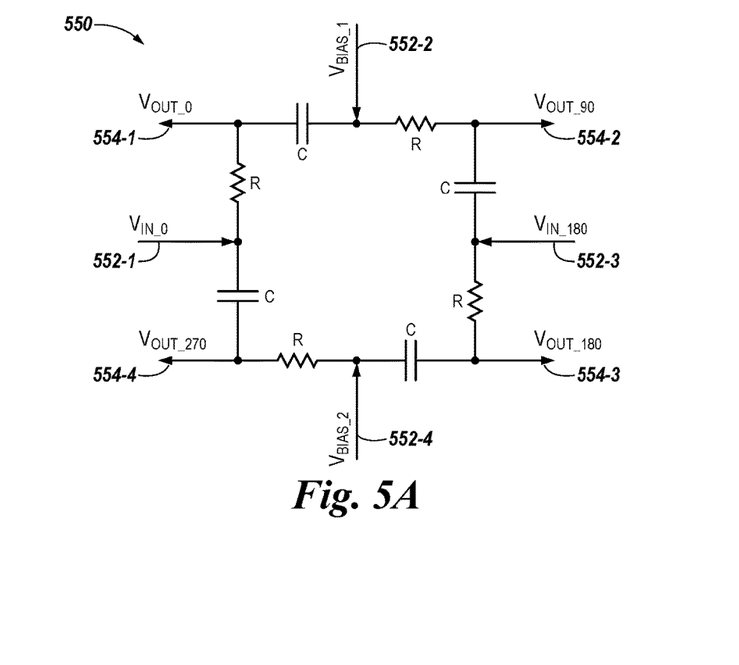
FIG. 5A-B illustrate an example filter bank of a quadrature signal generator in accordance with a number of embodiments of the present disclosure.
Figure 5B:
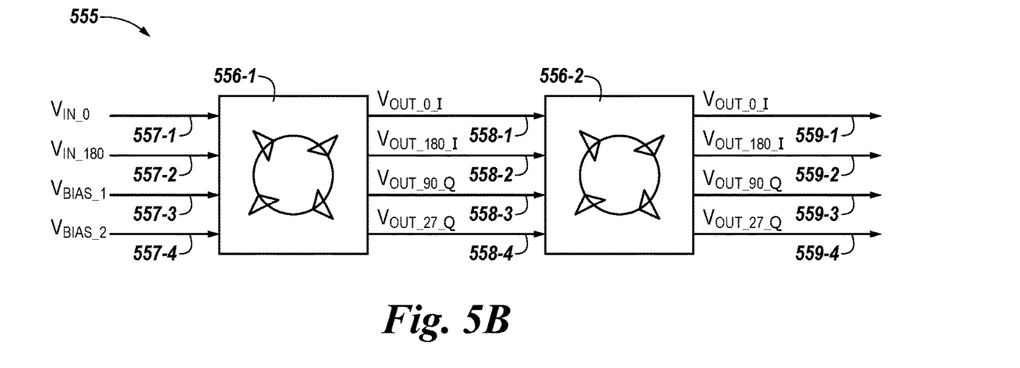

The filter bank 216 can receive the differential signal having the sinusoidal waveform from the smoothing filter 214 and be configured to generate a plurality of quadrature signals based on the received differential signal. In some embodiments, the filter bank 216 can be a particular type of filter bank such as a polyphase filter. An example filter bank is described below in association with FIG. 5.

The limiting amplifier block 218 can include a number of limiting amplifiers to receive and restore amplitude of the quadrature signals generated at the filter bank 216, which compensates an intrinsic loss that can be introduced by the filter bank 216, which can comprise a multi-stage polyphase filter. The limiting amplifier block 218 can further convert the quadrature signals (e.g., sinusoidal waveform) generated at the filter bank 216 to conform to a waveform of a timing clock of a memory system, which is a non-sinusoidal waveform. The limiting amplifier block 218 may further include an offset adjusting circuit for (e.g., coarse-tuning) offsets among the quadrature signals that can lead to duty cycle errors due to a low amplitude of the quadrature signals. An example limiting amplifier is described below in association with FIG. 6.

The output buffer 220 can be added subsequent to the limiting amplifier block 218 to further compensate an intrinsic loss introduced by the filter bank 216. In some embodiments, the output buffer 220 can be an integrated buffer of the limiting amplifier block 218.

The duty cycle/phase adjuster block 222 may include a duty cycle adjuster that is equivalent to the duty cycle adjuster 212 and a phase adjuster. While the duty cycle adjuster may be configured to adjust a duty cycle of quadrature signals received from the limiting amplifier block 218, the phase adjuster may be configured to correct (e.g., tune) phase errors among phases of the quadrature signals. As described in connection with FIG. 7, the duty cycle/phase adjuster block 222 may include a number of phase adjusters coupled to each pair of signals (e.g., I and Q signals) received from the limiting amplifiers 218. The differential signals filtered through a number of components of the quadrature signal generator 204 can be used to control memory system timing operations and can be referred to as quadrature clock signals. An example phase adjuster is described below in association with FIG. 7.

Figure 3:
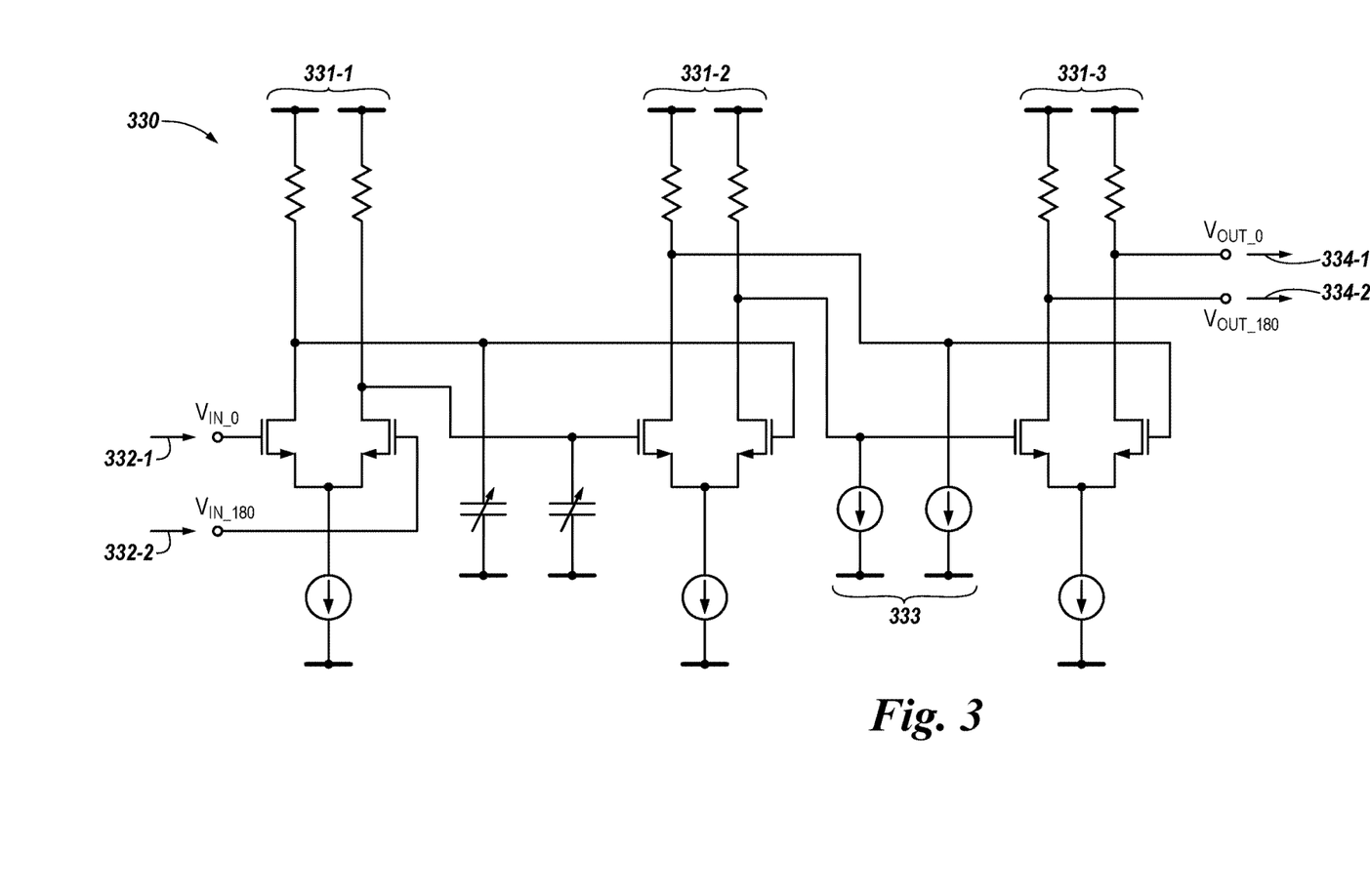
FIG. 3 illustrates an example duty cycle adjuster of a quadrature signal generator in accordance with a number of embodiments of the present disclosure.

FIG. 3 illustrates an example duty cycle adjuster 330 of a quadrature signal generator (e.g., quadrature signal generator 104 and 204) in accordance with a number of embodiments of the present disclosure. The duty cycle adjuster 330 may be analogous to the duty cycle adjuster 212 and/or the duty cycle adjuster included in the duty cycle/phase adjuster block 222, as described in connection with FIG. 2.

The duty cycle adjuster 330 may be a first component of the quadrature signal generator that receives differential signals (e.g., a pair of signals 332-1 and 332-2 corresponding to input voltages $V_{IN\_0}$ and $V_{IN\_180}$, respectively) from a clock generator (e.g., clock generator 102). The pair of signals 332-1 and 332-2 can be 180° out of phase with one another.

The duty cycle adjuster 330 includes a number of buffers 331-1, 331-2, and 331-3 (e.g., collectively referred to as buffers 331) that are coupled to each other in series. Although three buffers 331 are shown, embodiments are not limited to a particular quantity of buffers for the duty cycle adjuster 330.

As an example, the first buffer that receives the differential signals 332-1 and 332-2 can be configured to adjust rise/fall time of the differential signals using an adjustable capacitive load. The second buffer 331-2 can include a number of control bits 333 associated with current injection and shifting direct current (DC) level of outputs. Using the number of control bits 333, the second buffer 331-2 can be configured to adjust common mode voltage through phase-selectable current loading to shift direct current (DC) level of the outputs. The second buffer 331-2 can further be configured to provide a coarse-tuning (shift up and shift down) to cover a full amplitude of input signals. The third buffer 331-3 can provide sufficient gain and bandwidth to amplify the small correcting differential signals to full amplitude. Signals 334-1 and 334-2 (e.g., corresponding to $V_{OUT\_0}$ and $V_{OUT\_180}$, respectively) filtered through the buffers 331 can be provided to a smoothing filter, which is described in further detail in connection with FIG. 4.

Figure 4:
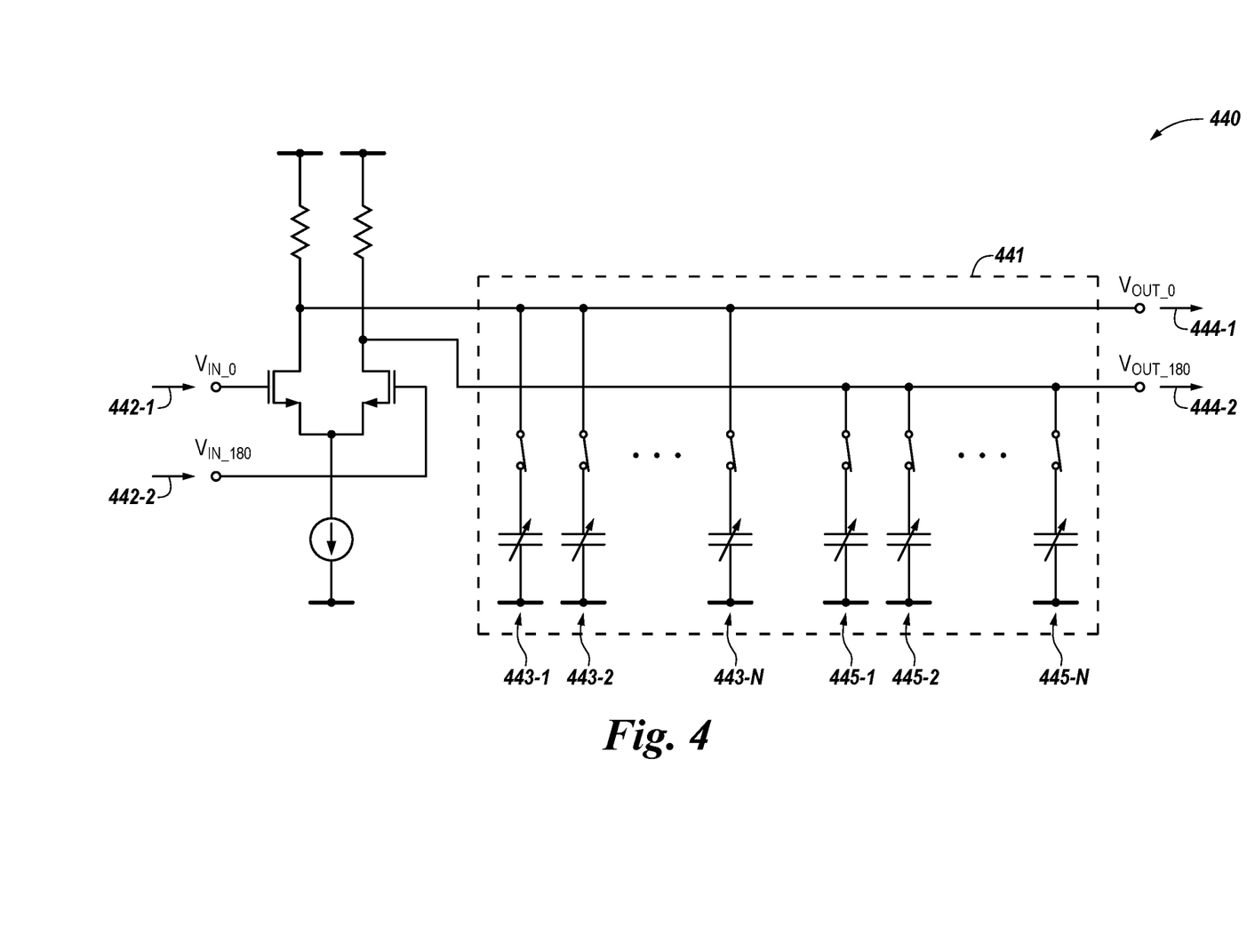
FIG. 4 illustrates a portion of an example smoothing filter of a quadrature signal generator in accordance with a number of embodiments of the present disclosure.

FIG. 4 illustrates a portion 440 of an example smoothing filter such as smoothing filter 214 shown in FIG. 2. The portion 440 illustrated in FIG. 4 can be one of a number of buffers in the smoothing filter. Therefore, the portion 440 can be referred to as a buffer 440.

The buffer 440 may be a first buffer of the smoothing filter. In this example, signals corresponding to input voltages $V_{IN\_0}$ and $V_{IN\_180}$, respectively may be signals received from a duty cycle adjuster (e.g., duty cycle adjuster 212 and/or 330). For example, a signal 442-1 corresponding to the input voltage $V_{IN\_0}$ can correspond to the signal 334-1 and a signal 442-2 corresponding to the input voltage $V_{IN\_180}$ can correspond to the signal 344-2. As described in connection with FIG. 3, the signals received from the duty cycle adjuster can be 180° out of phase with one another.

The buffer 440 may be coupled to a capacitor bank 441 via channels carrying signals 444-1 and 444-2, as illustrated in FIG. 4. For example, the capacitor bank 441 can include a number of control bits 443-1, 443-2, . . . 443-N (e.g., collectively referred to as control bits 443), and 445-1, 445-2, . . . 445-N (e.g., collectively referred to as control bits 445) coupled to a respective channel carrying signals 444-1 and 444-2, respectively. For example, the control bits 443-1, 443-2, . . 443-N can be coupled to the line carrying the signal 444-1, and the control bits 445-1, 445-2, . . 445-N can be coupled to the line carrying the signal 444-2.

Each buffer of the smoothing filter, such as the buffer 440, can be configured to reduce, using a capacitor corresponding to each control bit 443 and 445, a slew rate of the differential signals until the differential signals are converted to a sinusoidal waveform. As used herein, a slew rate refers to a change of an electrical quantity, such as voltage or current, per unit of time (e.g., volts/second or amperes/second). The slew rate of the signals 442-1 and 442-2 are reduced over the buffers of the smoothing filter, and output signals 444-1 and 444-2 (e.g., corresponding to $V_{OUT\_0}$ and $V_{OUT\_180}$, respectively) can have a sinusoidal waveform as opposed to a non-sinusoidal waveform of the input signals 442-1 and 442-2. The filtered output signals 444-1 and 444-2 can be provided to a next component of the quadrature signal generator such as a filter bank (e.g., filter bank 216).

In addition to those voltages $V_{OUT\_0}$ and $V_{OUT\_180}$ filtered from signals received from the duty cycle adjuster, the one of the buffers (e.g., bias buffer) of the smoothing filter can further provide bias voltages a filter bank. Accordingly, in a number of embodiments, two signals (e.g., corresponding to $V_{OUT\_0}$, $V_{OUT\_180}$) and a DC bias voltage can be provided to the filter bank, which is described further below.

FIG. 5A-B illustrate an example filter bank of a quadrature signal generator in accordance with a number of embodiments of the present disclosure. The filter bank or a portion of the filter bank illustrated in FIGS. 5A and 5B may be analogous to the filter bank 216 described in connection with FIG. 2. The filter bank 550 can be a multi-stage passive polyphase filter such as a two-stage passive polyphase filter, as illustrated in FIG. 5B.

FIG. 5A illustrates a portion of the filter bank 550 in accordance with a number of embodiments of the present disclosure. The portion of the filter bank 550 may be an individual stage of the multi-stage passive polyphase filter that can be a symmetric resistor-capacitor (RC) network with inputs and outputs symmetrically disposed in relative phases. Accordingly, the portion of the filter bank 550 can be referred to as a stage 550 of a multi-stage passive polyphase filter hereinafter. As an example, a resistor and a capacitor of the stage 550 can be a salicided P+poly resistor and an interdigitated metal-oxide-metal capacitor, respectively. The stage 550 illustrated in FIG. 5A may be analogous to a first stage (e.g., stage 556-1 illustrated in FIG. 5B) coupled to a smoothing filter (e.g., smoothing filter 440 as illustrated in FIG. 4).

The stage 550 includes four channels to receive a number of input signals (e.g., from the smoothing filter 440) such as signals 552-1, 522-2, 552-3, and 552-4 corresponding to $V_{IN\_0}$, $V_{IN\_90}$, $V_{BIAS\_1}$, and $V_{BIAS\_2}$, respectively. Output signals 554-1, 554-2, 554-3, and 554-4 (e.g., corresponding to $V_{OUT\_0}$, $V_{OUT\_180}$, $V_{OUT\_90}$, and $V_{OUT\_270}$, respectively) of the stage 550 can be I signals and Q signals, which are 90° out of phase-shifted relative to each other. For example, the signal 554-2 is 90° out of phase-shifted relative to the signal 554-1; therefore, the signal 554-2 may be Q signal and the signal 554-1 may be I signal. For example, the signal 554-4 is 90° out of phase-shifted relative to the signal 554-3; therefore, the signal 554-4 may be Q signal and the signal 554-3 may be I signal. As described in connection with FIG.

4, DC bias voltages $V_{BIAS\_1}$, and $V_{BIAS\_2}$ can be received from a bias buffer of the smoothing filter. In some embodiments, the DC voltages may be carried from the bias buffer to the stage 550 via an individual channel.

FIG. 5B illustrates a multi-stage passive polyphase filter 555 in accordance with a number of embodiments of the present disclosure. The multi-stage passive polyphase filter 555 includes two stages 556-1 and 556-2.

The stage 550 described in connection with FIG. 5A can be cascaded into two stages 556-1 and 556-2, although embodiments are not so limited. Designing a multi-stage passive polyphase filter 555 with stages cascaded from a stage such as the stage 550 may reduce design sensitivity to variable values of passive components of the stages 556-1 and 556-2, which can reduce complexity in designing the multi-stage passive polyphase filter 555.

Increasing a number of stages of the multi-stage passive polyphase filter can provide benefits such as higher frequencies that output signals operate within; therefore, providing a wider bandwidth. To compensate or prevent signal loss (e.g., attenuation) due to the increased number of stages of the filter, impedance matching must be accounted for. To account for the impedance matching, for example, input impedance can be added to each channel receiving an input voltage and/or output impedance can be added to each channel providing an output voltage to a next component of the filter. While embodiments are not limited to a particular value of the input and output impedances, values of the respective input and output impedances can be sufficient to increase an amplitude of the signals.

In some embodiments, a number of stages may be further added as dummy stages (e.g., in parallel with the stages 556-1 and 556-2). These dummy stages may be used to shield against lithograph edge effects and reduce the variance in a number of stages including the stages 556-1 and 556-2.

The first stage 556-1 includes four channels 557-1, 557-2, 557-3, 557-4 (e.g., collectively referred to as channels 557) to receive inputs from a smoothing filter (e.g., smoothing filter 440). As illustrated in FIG. 5, two channels 557-1 and 557-2 receive signals corresponding to input voltages $V_{IN\_0}$ and $V_{IN\_180}$ that are 180° out of phase with one another. Other two channels 557-3 and 557-4 are connected to a bias buffer in the smoothing filter that provides a DC voltage(s) ($V_{BIAS\_1}$ and $V_{BIAS\_2}$). A number of embodiments are not limited to a particular number of channels via which the bias buffer is coupled to the polyphase filter 555. For example, a number of embodiments can include an individual channel for carrying the DC voltage, although, in FIG. 5B, two channels 557-3 and 557-4 are illustrated as channels for carrying the DC bias voltages from the bias buffer.

The outputs voltages $V_{OUT\_0\_I}$, $V_{OUT\_180\_I}$, $V_{OUT\_90\_Q}$, and $V_{OUT\_270\_Q}$ of the first stage 556-1 of the multi-stage passive polyphase filter 555 can be provided to the second stage 556-2 as inputs. The second stage 556-2 receives voltages $V_{OUT\_0\_I}$, $V_{OUT\_180\_I}$, $V_{OUT\_90\_Q}$, and $V_{OUT\_270\_Q}$ via channels 558-1, 558-2, 558-3, and 558-4, respectively. In connecting the first stage 556-1 and the second stage 556-2, high layer metal may be used to mitigate resistive effects. Further, a length of the channels 558-1, 558-2, 558-3, and 558-4 may be substantially equal to one another to balance a parasitic interconnect resistance and parasitic capacitors in the stages 556-1 and 556-2.

The outputs from the second stage 556-2 may be provided to a next component via channels 559-1, 559-2, 559-3, and 559-4, and may be quadrature signals (e.g., including I and Q signals) that are 90° out of phase with each other in each quadrant. Two signals (e.g., among those quadrature signals generated at the second stage 556-2) can serve as a pair of differential signals that are complementary to one another. For example, $V_{OUT\_0\_I}$ and $V_{OUT\_180\_I}$ can be paired to serve as a first pair of differential signals (e.g., I signals), and $V_{OUT\_90\_Q}$ and $V_{OUT\_270\_Q}$ can be paired to serve as a second pair of differential signals (e.g., Q signals).

In a number of embodiments, a wideband frequency range can be provided by signals corresponding to the output voltages $V_{OUT\_0\_I}$, $V_{OUT\_180\_I}$, $V_{OUT\_90\_Q}$, and $V_{OUT\_270\_Q}$ while each signal may have a frequency equal to at least one of the differential signals provided to the quadrature signal generator. For example, when an operating frequency of the PLL is 5 GHz; thus, provides differential signals of 5 GHz, quadrature signals may also be generated at 5 GHz. Accordingly, embodiments of the present disclosure provide bandwidths of the wideband frequency range, while not requiring the operating frequency of the PLL to be twice of the desired frequency, such as occurs if a divide-by-two circuit is used for quadrature signal generation.

Figure 6:
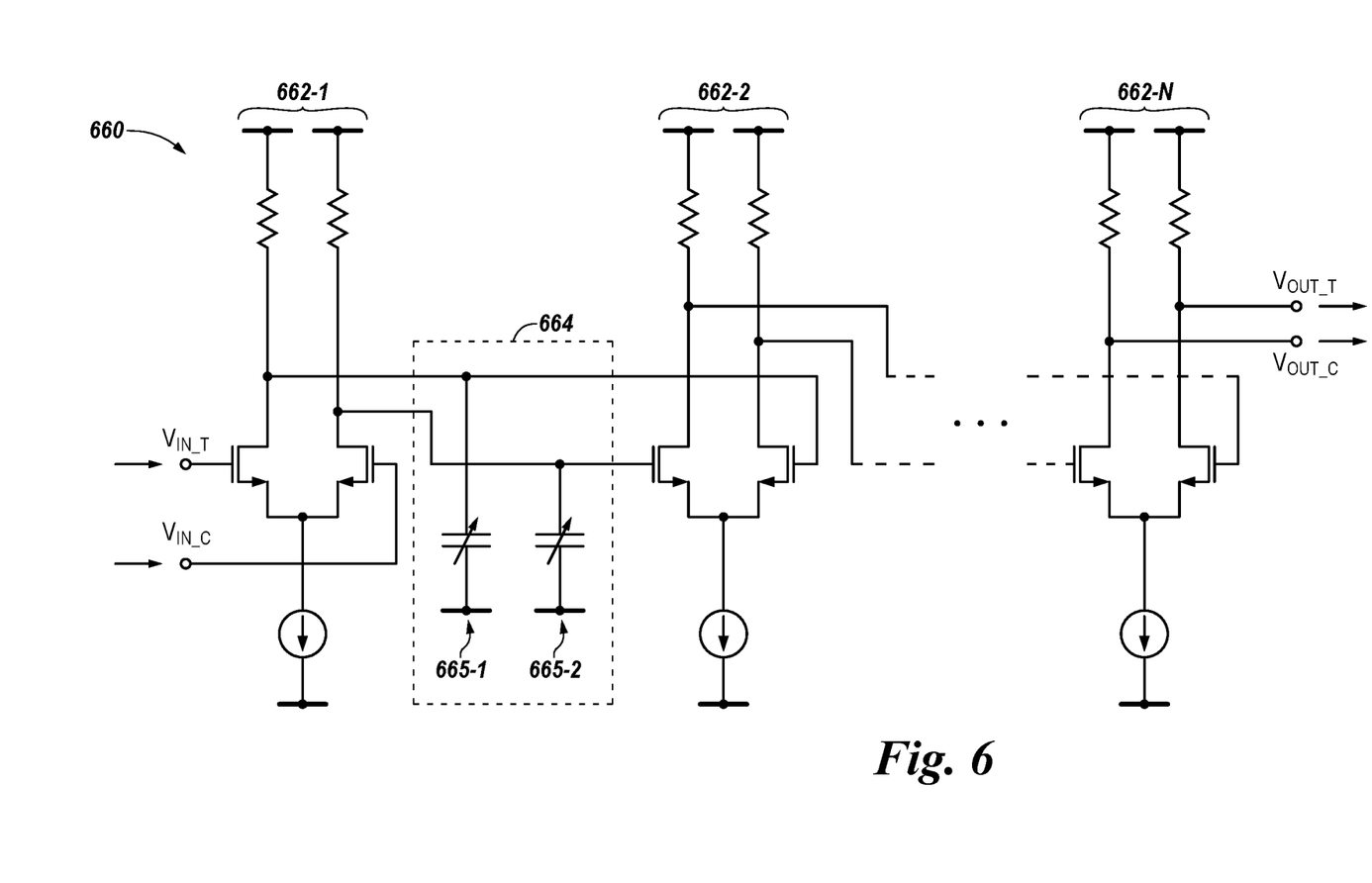
FIG. 6 illustrates an example limiting amplifier of a quadrature signal generator in accordance with a number of embodiments of the present disclosure.

FIG. 6 illustrates an example limiting amplifier 660 of a quadrature signal generator in accordance with a number of embodiments of the present disclosure. The limiting amplifier 660 can be configured to receive a pair of signals $V_{IN\_T}$ and $V_{IN\_C}$ from a filter bank (e.g., multi-stage passive polyphase filter 555). In one example, the limiting amplifier 660 can be configured to receive a pair of I signals corresponding to output voltages $V_{OUT\_0\_I}$ and $V_{OUT\_180\_I}$ (e.g., as illustrated in FIG. 5) from the filter bank, and in another example, the limiting amplifier 660 can be configured to receive a pair of Q signals corresponding to output voltages $V_{OUT\_90\_Q}$, and $V_{OUT\_270\_Q}$ (e.g., as illustrated in FIG. 5) from the filter bank. Accordingly, the quadrature signal generator (e.g., quadrature signal generator 104 and 204) can include at least two limiting amplifiers configured to receive respective I and Q signals.

The limiting amplifier 660 can include a number of buffers 662-1, 662-2, . . . , 662-N (e.g., collectively referred to as buffers 662). The first stage 662-1 of the limiting amplifier 660 can be used to optimize impedance matching.

The quadrature signals generated and received from the filter bank can be of a low amplitude, which can lead to duty cycle errors due to offsets among the quadrature signals corresponding to voltages $V_{IN\_T}$ and $V_{IN\_C}$. In some embodiments, at least one of the stages 662 may include an offset adjusting circuit 664, which can be controlled by a number of control bits such as control bits 665-1 and 665-2. The offset adjusting circuit provides a coarse tuning for offsets among the quadrature signals $V_{IN\_T}$ and $V_{IN\_C}$, which eliminates/reduces the duty cycle errors. Although embodiments are not so limited, the offset adjusting circuit may be current-based, and can be placed between the first stage 662-1 and the second stage 662-2, as illustrated in FIG. 6.

The quadrature signals received from the filter bank may be a sinusoidal waveform. Contrary to the sinusoidal waveform that the filter bank operates with, clock signals that are used to control timing operations of a memory system can be a non-sinusoidal waveform such as a square waveform, which can be beneficial for digital applications, for instance. As such, the number of stages 662 may be configured to convert the quadrature signals to a non-sinusoidal waveform. The quantity of stages of the limiting amplifier 660 may be configurable based on, for example, a desired output drive capability, desired bandwidth, and/or a desired noise level associated with the quadrature signals.

Figure 7:
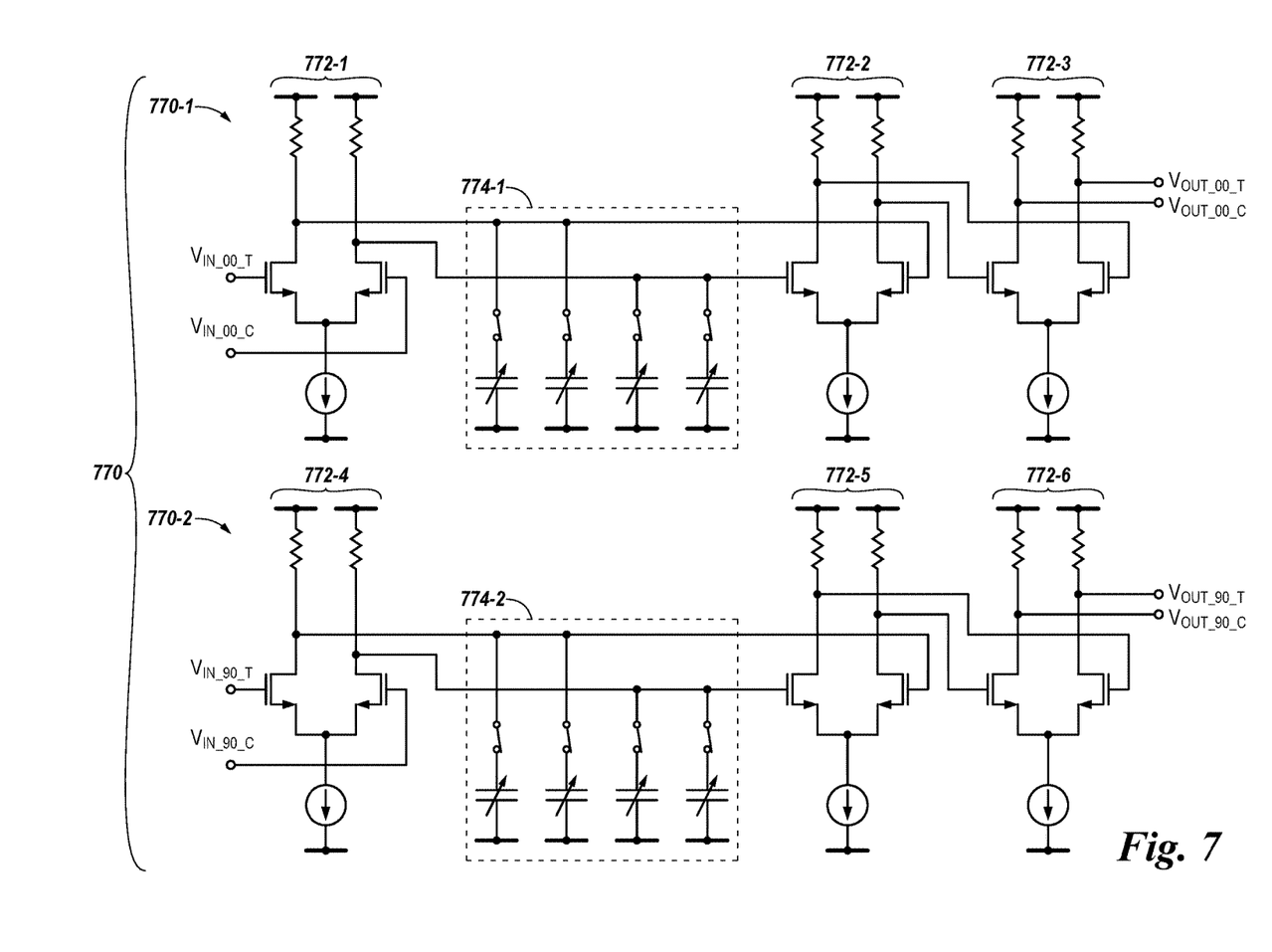
FIG. 7 illustrates example phase adjusters of a quadrature signal generator in accordance with a number of embodiments of the present disclosure.

FIG. 7 illustrates example phase adjusters 770-1 and 770-2 (e.g., collectively referred to as phase adjusters 770)

of a quadrature signal generator in accordance with a number of embodiments of the present disclosure. Each phase adjuster 770-1 and 770-2 can be configured to receive a respective pair of signals from a respective one of limiting amplifiers (e.g., limiting amplifier 660). For example, the phase adjuster 770-1 receives I signals (e.g., generated at the multi-stage polyphase filter 555 and filtered at one of the limiting amplifiers such as the limiting amplifier 660) corresponding to $V_{IN\_00\_T}$ and $V_{IN\_00\_C}$ and phase adjuster 770-2 receives Q signals (e.g., generated at the multi-stage polyphase filter 555 and filtered at another one of the limiting amplifiers such as the limiting amplifier 660) corresponding to $V_{IN\_90\_T}$ and $V_{IN\_90\_C}$, as illustrated in FIG. 7. Accordingly, each pair of signals corresponding to $V_{IN\_00\_T}$, $V_{IN\_00\_C}$ and/or $V_{IN\_90\_T}$, $V_{IN\_90\_C}$ is complementary signals having data values of true and complement.

The phase adjuster 770-1 includes a number of buffers 772-1, 772-2, 772-3, and the phase adjuster 770-2 includes a number of buffers 772-4, 772-5, and 772-6. Each phase adjuster 770 further includes a respective capacitor bank 774-1 (e.g., or 774-2) placed between a first buffer 772-1 (e.g., or 772-4) and a second buffer 772-2 (e.g., or 772-5). Each capacitor bank 774-1 and 774-2 can include a number of control bits coupled to a respective channel. The number of control bits can be used to change the slew rate of outputs of the first buffer 774-1 and 774-4 to compensate errors between I and Q signals. Other buffers such as the second buffer 772-2, 772-5 and the third buffer 772-3, 772-6 can bring the low slew rate of the I and Q signals back and cancel the phase errors between the I and Q signals.

Figure 8:
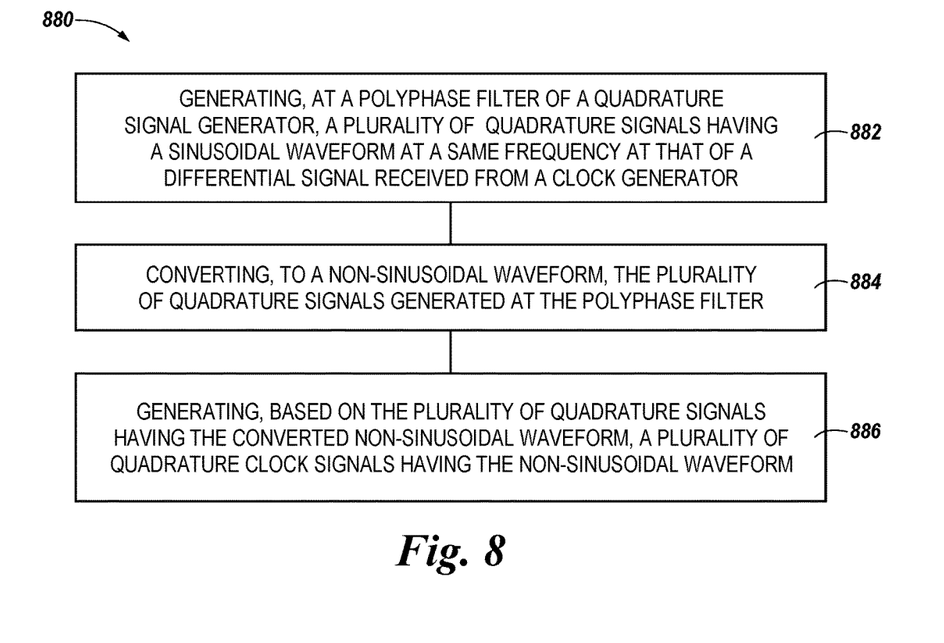
FIG. 8 is a flow chart illustrating an example of method for generating quadrature clock signals in accordance with a number of embodiments of the present disclosure.

FIG. 8 is a flow chart illustrating an example of method 880 for generating quadrature clock signals in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 882, the method 880 includes generating, at a polyphase filter of a quadrature signal generator, a plurality of quadrature signals having a sinusoidal waveform at a same frequency as that of a differential signal received from a clock generator. In some embodiments, the method 880 may further include, prior to generating the plurality of quadrature signals, adjusting a duty cycle of the differential signal having the non-sinusoidal waveform.

At block 884, the method 880 includes converting, to a non-sinusoidal waveform, the plurality of quadrature signals generated at the polyphase filter. Converting the waveform of the differential signal having the non-sinusoidal waveform to the sinusoidal waveform may include changing a slew rate of the plurality of quadrature signals generated at the polyphase filter until a waveform of the plurality of quadrature signals is converted to the non-sinusoidal waveform. For example, the slew rate of the plurality of quadrature signals may be reduced/increased for the conversion of the sinusoidal waveform to the non-sinusoidal waveform. In some embodiments, the method 880 may further include correcting a phase error between an in-phase (I) signal and a quadrature (Q) signal of the plurality of quadrature signals generated at the polyphase filter.

At block 886, the method 880 includes generating, based on the plurality of quadrature signals having the converted non-sinusoidal waveform, a plurality of quadrature clock signals having the non-sinusoidal waveform (e.g., square waveform). Embodiments of the present disclosure can generate quadrature clock signals generated at a same frequency as that of those clock signals received from a clock generator. Accordingly, the clock generator is not required to operate in a frequency greater than the desired frequency quadrature clock signals are to be operated. Further, embodiments can provide generate quadrature clock signals operating in a wideband frequency range (e.g., 2.5 gigahertz (GHz) to 5 GHz) to meet high bandwidth requirements of state-of-the-art circuits and systems such as DDR memory systems). Accordingly, embodiments can provide benefits such as generating quadrature clock signals operating in the wideband frequency range without requiring a larger inductor area and/or with reduced phase noise and power usage.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a quadrature signal generator configured to:
        generate, based on a received differential signal, a plurality of quadrature clock signals at a same frequency as that of the received differential signal; and
        provide the plurality of quadrature clock signals to a memory system;
    wherein:
        the filter bank is one of a plurality of components included in the quadrature signal generator;
        at least one of the plurality of components comprises a capacitor bank whose constituent capacitors are controllable by respective control bits.

2. The apparatus of claim 1, wherein the differential signal is received from a clock generator coupled to the quadrature signal generator.

3. The quadrature signal generator of claim 2, wherein the clock generator comprises a phase locked loop (PLL).

4. The apparatus of claim 1, wherein the quadrature signal generator comprises a filter bank and is configured to use the filter bank to generate the plurality of quadrature clock signals.

5. A quadrature signal generator, comprising:
    an input channel configured to receive a differential signal having a non-sinusoidal waveform from a clock generator, wherein the quadrature signal generator is configured to convert the received differential signal to a sinusoidal waveform; and a polyphase filter configured to:
  receive the differential signal having the converted sinusoidal waveform; and
  generate a plurality of quadrature signals having the sinusoidal waveform.

6. The quadrature signal generator of claim 5, wherein the quadrature signal generator is configured to:
  convert the plurality of quadrature signals generated at the polyphase filter to the non-sinusoidal waveform; and
  generate, based on the plurality of quadrature signals having the converted non-sinusoidal waveform, a plurality of quadrature clock signals having the non-sinusoidal waveform;
  wherein the plurality of quadrature clock signals generated at the quadrature clock generator are used to control timing operations of a memory system.

7. The quadrature signal generator of claim 5, wherein the polyphase filter comprises a plurality of filter input channels, and wherein:
  at least a portion of the plurality of filter input channels is configured to receive the differential signal having the converted sinusoidal waveform; and
  at least another portion of the plurality of filter input channels is configured to receive a DC bias voltage.

8. The quadrature signal generator of claim 5, further comprising a duty cycle adjuster configured to adjust a duty cycle of the differential signal received from the clock generator.

9. The quadrature signal generator of claim 5, further comprising a smoothing filter, and the quadrature signal generator is configured to use the smoothing filter to convert the waveform of the differential signal.

10. The quadrature signal generator of claim 5, further comprising a limiting amplifier sub-block, and wherein the quadrature signal generator is configured to use the limiting amplifier sub-block to convert the plurality of quadrature signals generated at the polyphase filter to the non-sinusoidal waveform.

11. The quadrature signal generator of claim 5, wherein the limiting amplifier sub-block comprises an offset adjuster configured to correct a duty cycle error of the plurality of quadrature signals generated at the polyphase filter.

12. The quadrature signal generator of claim 5, further comprising a phase adjuster, and the quadrature signal generator is configured to correct, using the phase adjuster, a phase error between an in-phase (I) signal and a quadrature (Q) signal of the plurality of quadrature signals generated at the polyphase filter.

13. The quadrature signal generator of claim 5, wherein the polyphase filter is a passive polyphase filter (PPF).

14. A method, comprising:
  generating, at a polyphase filter of a quadrature signal generator, a plurality of quadrature signals having a sinusoidal waveform at a same frequency as that of a differential signal received from a clock generator;
  converting, to a non-sinusoidal waveform, the plurality of quadrature signals generated at the polyphase filter; and
  generating, based on the plurality of quadrature signals having the converted non-sinusoidal waveform, a plurality of quadrature clock signals having the non-sinusoidal waveform.

15. The method of claim 14, further comprising:
  receiving the differential signal having the non-sinusoidal waveform from the clock generator;
  converting a waveform of the differential signal having the non-sinusoidal waveform to the sinusoidal waveform; and
  providing, to the polyphase filter, the differential signal having the sinusoidal waveform such that the plurality of quadrature signals are generated based on the differential signal having the sinusoidal waveform.

16. The method of claim 14, further comprising, prior to generating the plurality of quadrature signals, adjusting a duty cycle of the differential signal having the non-sinusoidal waveform.

17. The method of claim 14, converting the waveform of the differential signal having the non-sinusoidal waveform to the sinusoidal waveform further comprises changing a slew rate of the plurality of quadrature signals generated at the polyphase filter until a waveform of the plurality of quadrature signals is converted to the non-sinusoidal waveform.

18. The method of claim 14, further comprising correcting a phase error between an in-phase (I) signal and a quadrature (Q) signal of the plurality of quadrature signals generated at the polyphase filter.

19. The method of claim 14, wherein the non-sinusoidal waveform is a square waveform, and wherein the method further comprises providing the plurality of quadrature clock signals to a memory system.

* * * * *